United States Patent [19]

Nuzillat et al.

[11] Patent Number: 4,485,316

[45] Date of Patent: Nov. 27, 1984

[54] LOGIC INVERTER, AND A MULTI-OUTPUT LOGIC OPERATOR DERIVED FROM THIS INVERTER, USING AT LEAST TWO LOW-VOLTAGE-THRESHOLD FIELD-EFFECT TRANSISTORS

[75] Inventors: Gérard Nuzillat; Tung Pham Ngu; Georges Bert, all of Paris, France

[73] Assignee: Thomson-CSF, Paris, France

[21] Appl. No.: 275,623

[22] Filed: Jun. 22, 1981

[30] Foreign Application Priority Data

Jun. 24, 1980 [FR] France ................... 80 13964

[51] Int. Cl.³ ................ H03K 19/017; H03K 19/094; H03K 19/20; H03K 19/21
[52] U.S. Cl. .................................... 307/446; 307/450; 307/471; 364/784
[58] Field of Search ............... 307/443, 446, 450, 471, 307/472, 475; 364/768, 769, 784-788

[56] References Cited

U.S. PATENT DOCUMENTS 3,969,632  7/1976  Bobenrieth ............ 307/450 X
4,300,064  11/1981  Eden .................... 307/446
4,394,589  7/1983  Pham et al. ........... 307/446 X

FOREIGN PATENT DOCUMENTS 2510604  9/1975  Fed. Rep. of Germany ...... 307/475

OTHER PUBLICATIONS

Nuzillat et al., "L.S.I. Oriented Logic Approach Using Quasinormally Off GaAs MESFETs"; IEE Proc., vol. 127, Pt. I, No. 5; pp. 287-296; 10/1980.
Vantuyl et al., "High-Speed Integrated Logic with GaAs MESFETs"; IEEE-JSSC, vol. SC-9, No. 5, pp. 269-276; 10/1974.
Supplement to the Journal of the Japan Society of Applied Physics: Proceedings of the 6th Conference on Solid State Devices, vol. 44, Tokyo 1974/1975; Tokyo (JP); Suzuki et al.: "Logic Circuits with 2 µm Gate Schottky Barrier FETs", pp. 219-224.
Proceedings of the IEEE, vol. 67, No. 3, Mar. 1979; New York (US); B. G. Bosch: "Gigabit Electronics—a Review", pp. 340-379.
IEEE International Solid State Circuit Conference, Feb. 14, 1980, New York (US); R. C. Eden et al.: "Multi-Level Logic Gate Implementation in GaAs ICs using Schottky Diode-FET Logic", pp. 122-123 and 265-266.
IEEE Transactions on Electron Devices, vol. ED-27, No. 6, Jun. 1980, New York (US); G. Nuzillat et al.: "Quasi-Normally-Off MESFET.

Primary Examiner—Larry N. Anagnos
Attorney, Agent, or Firm—Oblon, Fisher, Spivak, McClelland & Maier

[57] ABSTRACT

A high-speed logic inverter, in the form of an integrated circuit, with a single supply source, using field-effect transistors of the "quasi-normally-off" type, and the logic operators having several inputs and several outputs which derive therefrom.

One embodiment of the invention starts from an inverter with input, through a diode, on a field-effect transistor gate, and with its output at the source of a field-effect transistor. This basic diagram is added to by providing the input (between supply pole and input terminal) with two pairs of diodes ending at the gates of a dual-gate transistor, and by providing independent outputs obtained by connecting the common drain connected transistor gates to the supply pole distinct from ground.

8 Claims, 24 Drawing Figures

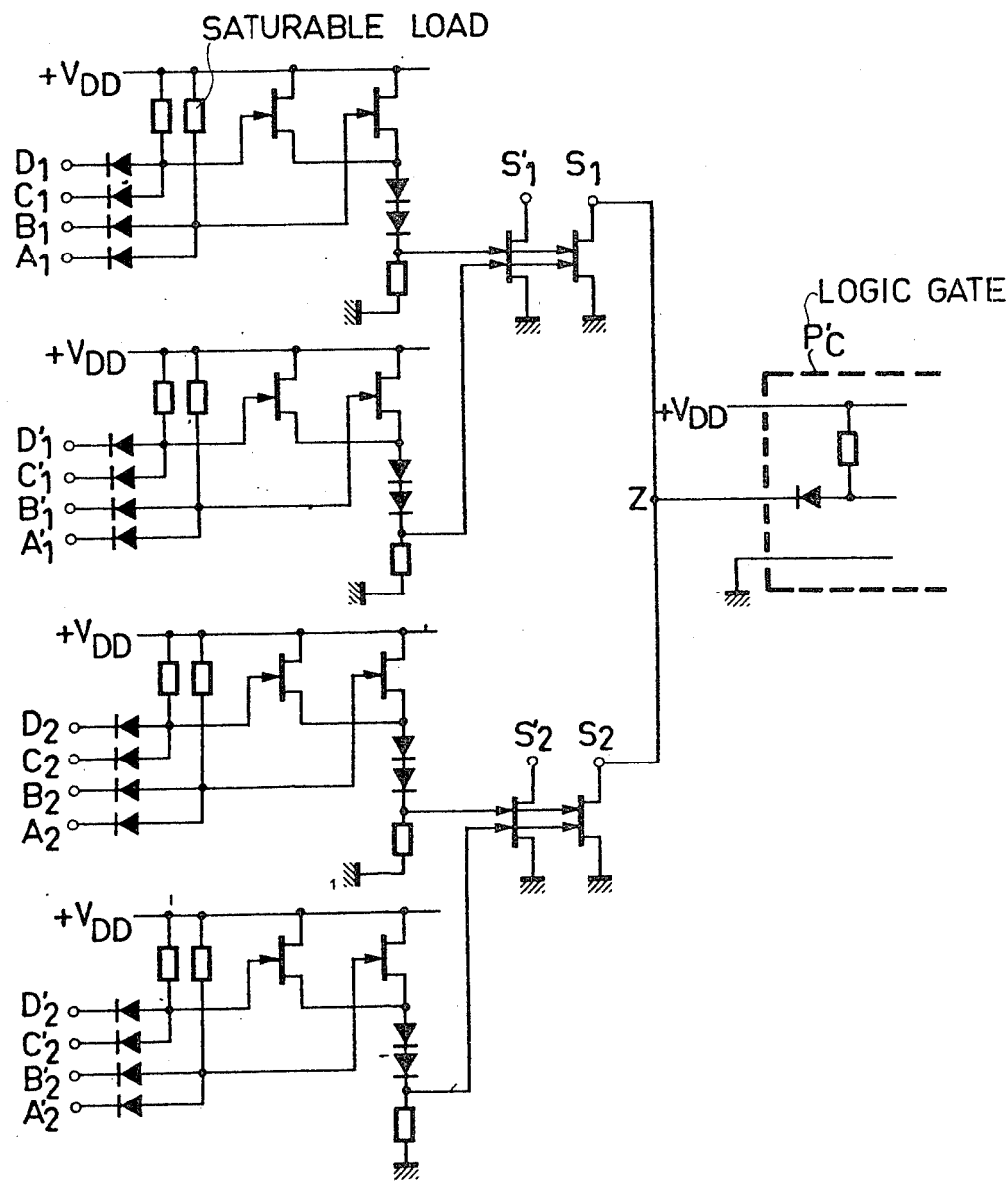

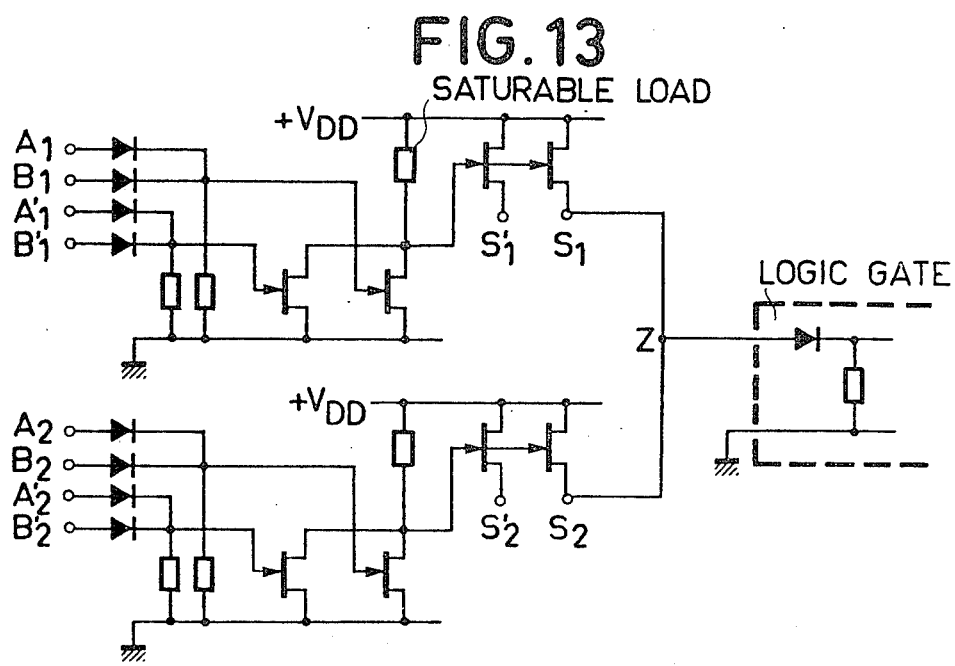
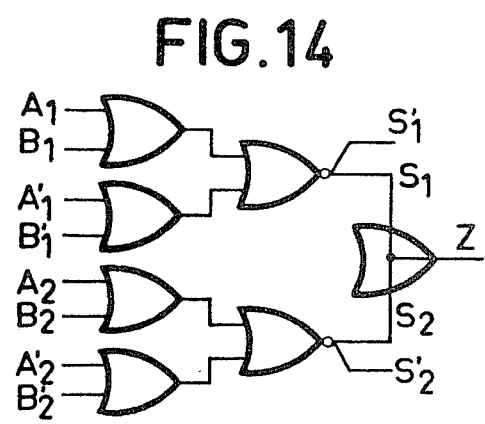
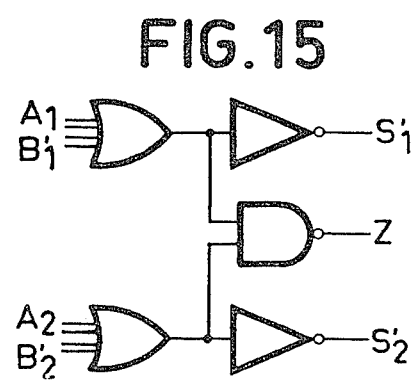

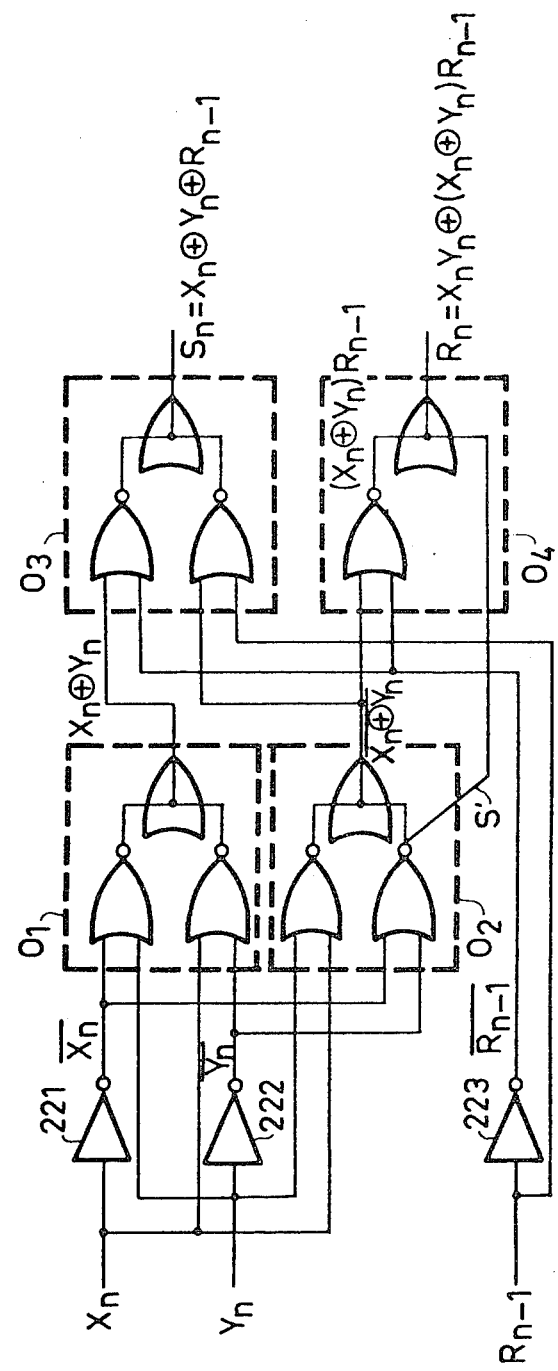

LOGIC INVERTER, AND A MULTI-OUTPUT LOGIC OPERATOR DERIVED FROM THIS INVERTER, USING AT LEAST TWO LOW-VOLTAGE-THRESHOLD FIELD-EFFECT TRANSISTORS

BACKGROUND OF THE INVENTION

The invention relates to a high-speed logic inverter, having a single power supply source, using a so-called "quasi-normally off" low-voltage threshold field-effect transistor. It also relates to multi output logic operators, constructed from this inverter, and providing more or less complex logic functions. It may be produced as integrated circuits.

Conventionally, so-called normally-on field-effect transistors and normally-off transistors are known, the first are cut off by depletion, requiring a double-polarity supply source and having moreover the disadvantage of consuming electric current in the rest state. The second let the current pass when an appropriate voltage is applied to the control gate: they do not require a double-polarity power supply and are more economical but, on the other hand, difficult to produce because of the very small thickness of the conduction channel while giving rise to a large amount of manufacturing waste.

A third category of field-effect transistors, which is intermediate between the two preceding ones while approximating to the second kind, is formed by quasi-normally-off transistors; they are cut off for a threshold voltage $V_T$ which may be positive or negative, which means that a certain spread in the collective manufacture of these transistors may be admitted which is for example the following:

$$-0.4 \leq V_T \leq 0.2 \text{ volt}$$

This latter category is easier to manufacture than the second but more difficult to use. It is known, more especially by means of the technique described in French patent document No. 2 449 369 filed on Feb. 13, 1979 by the Applicant, how to produce low-voltage threshold transistors and a logic inverter for use. In this technique, a trench is hollowed out, by ionic erosion, between the source and the drain, which forms a very-low-consumption saturable resistance which may be transformed into a field-effect transistor by depositing a metal layer at the bottom of the trench at the position of the control gate and for fulfilling the function thereof. However, the loads achieved by this technology present a certain spread of the characteristics. Therefore because of this spread, the threshold voltage is sometimes positive, sometimes negative; in the case when it is negative, the input transistor is not cut off, which presents an entrance reduction, prohibiting in particular the formation of multiple inputs.

The construction of multiple-input logic gates, carrying out complex logic functions, and in which the propagation time of the logic signals is no greater than in the basic logic inverter described in the above-mentioned patent application, having a transistor of the "virtually normally off" type, is described in French patent application No. 80 11 550 filed on May 23, 1980 by the Applicant.

Now the structures of these gates correspond to an organization of the purely "convergent" type, i.e. comprising several inputs and a single output.

So as to obtain gates with a single input and several independent outputs (so-called "divergent" logic), capable of being wired up with other gates without troublesome mutual interaction, recourse is had to bipolar transistors of a special technique, for example the so-called "I²L" technique. Now, in ultrahigh-speed logic on gallium arsenide, one is obliged to use from a practical point of view the field-effect transistor and, furthermore, of the "quasi-normally off" type, if it is desired to have a single power supply source only.

But the family of logic operators derived from the basic logic inverter, in this technique, is solely convergent, as can be seen in the second above-mentioned patent application. The basic inverter does not lend itself to the formation of operators having several independent outputs.

SUMMARY OF THE INVENTION

The aim of the invention is to create a new family of logic operators having, or capable of having, several inputs and also several independent outputs, i.e. to produce a "convergent-divergent" logic.

The logic inverter of the invention uses two field-effect transistors of the quasi-normally-off type and comprises an input terminal intended to be excited by logic signals applied between this terminal and a pole of the single power supply source, the other pole of which source being grounded. It comprises further:

an input branch consisting of a diode in series with a first resistive load one terminal of which is grounded;

a middle branch, consisting of a second resistive load one terminal of which is connected to said pole and a first transistor the source of which is grounded, the drain connected to the second resistive load and the gate connected to the point situated between the diode and the first resistive load;

an output branch consisting of a second transistor whose drain is connected to said pole, the source to the output terminal of the inverter and the gate to the point situated between the drain of the first transistor and the second resistive load, the logic signals being collected between the output terminal and ground.

According to a variation of the invention, in a logic inverter using two field-effect transistors of the quasi-normally-off type, there is provided an input terminal intended to be excited by logic signals applied between this terminal and ground. There is further provided an input branch comprising:

either a resistive load connected between this terminal and a pole of the power supply source not connected to ground;

or a diode in series with a first resistive load connected between this terminal and a pole of the power supply source not connected to ground, the diode conducting in the direction going from ground to the input terminal.

Moreover, it comprises a middle branch having in series a second resistive load one terminal of which is connected to ground, a diode completed by an additional diode in series in the case where the input branch itself comprises a diode, and a transistor having its drain connected to said pole, its source connected to a diode of the middle branch, its gate connected to the terminal of the first resistive load not connected to said pole.

Finally, it comprises an output branch having a transistor with its source grounded, its gate connected to the terminal of the second resistive load not connected to ground and its drain connected to an output terminal delivering logic signals between this terminal and said pole, the diode(s) of the middle branch conducting in the direction going from said pole to ground.

DESCRIPTION OF THE DRAWINGS

The invention will be better understood, and other characteristics will appear from the following description and accompanying drawings in which:

FIGS. 8, 10, 12, 13, 16, 19 and 22 show other operators of the invention;
FIGS. 9, 11, 14, 15, 17, 18, 20 and 21 are equivalent logic diagrams.

DESCRIPTION OF THE PREFERRED EMBODIMENTS

Figure 1:
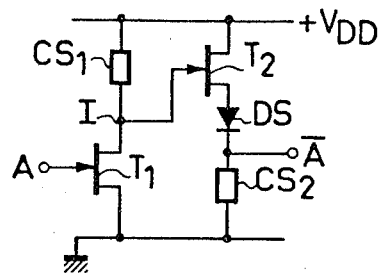
FIG. 1 shows a logic inverter of known type.

In FIG. 1 there is shown a logic inverter whose input A is connected to the gate electrode of transistor $T_1$ which is of the quasi-normally-off type. This transistor has its source grounded, its drain connected to a point I itself connected to the hot point corresponding to a pole (positive in this example) of a source $V_{DD}$ through a resistive load $CS_1$. The example chosen corresponds to the case of the n channel transistor $T_1$. For a p channel the polarities must be reversed.

Point I is connected to the gate electrode of a transistor $T_2$ of the same type as $T_1$. Transistor $T_2$ has its drain connected to the pole $+V_{DD}$, its source to a diode DS, conducting in the direction going from $+V_{DD}$ to ground. The ground return takes place through a resistive load $CS_2$. The output A of the inverter is taken between DS and $CS_2$.

The operating rules of the inverter will be briefly recalled. When the input A is in the "0" state (zero or slightly negative potential) transistor $T_1$ is quasi-cut off. The potential at point I is close to that of the pole $+V_{DD}$. With the gate-source junction of transistor $T_2$ forwardly biased, the potential of the source tends to rise, as well as output A, but with a voltage shift due to the diode. The state "1" is present at the output, whose potential is positive because of the presence of the resistive load $CS_2$.

When the input A is in the "1" state (for example close to 0.8 volt) the potential of point I is low, of the order of the residual voltage of transistor $T_1$, and transistor $T_2$ is consequently cut off through its gate. It can be shown that, because of the presence of diode D, the potential of output A is close to ground ("0" state).

It can easily be shown that the operation of the inverter is correct if the threshold voltage is between the limits:

$$-0.4 \text{ V} \leq V_T \leq +0.2 \text{ V}$$

It can also be shown that, if an input is added using a dual-gate transistor $T_1$, thus forming a gate of the dual-input NAND type, the operation remains satisfactory, and presents a certain margin of correct operation if noise is present in the input signal.

In the family of multiple-input logic operators described in the second above-mentioned application, putting more than two gates in parallel on the same transistor is avoided so as to preserve a margin of acceptable operation in the presence of noise. Similarly, putting more than two transistors of the quasi-normally-off type in parallel in the same branch of such logic operators is avoided.

At the basis of the present invention we find the definition of inverters derived from the inverter of FIG. 1, while reorganizing a chain of such inverters.

Figure 2:
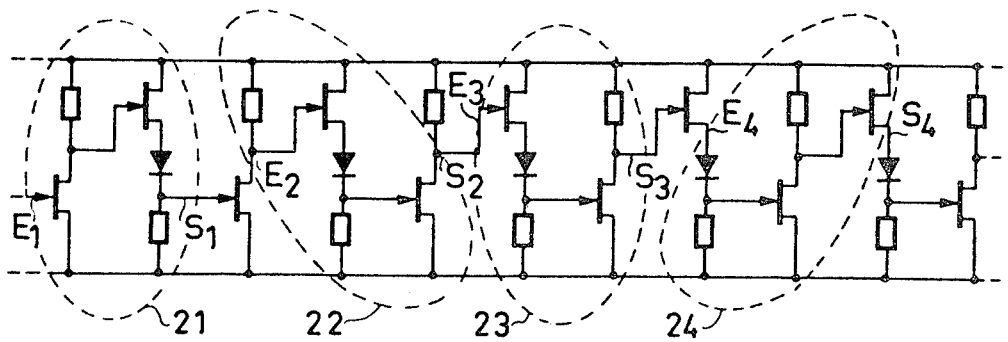
FIG. 2 shows a chain of inverters of the same type.

FIG. 2 shows such a chain, in which the output of one inverter is connected to the input of the following inverter.

Thanks to the property of this inverter of being "compatible," the input signal or its complement should be found, without distortion and without drift of the voltages of level 1 or 0, at the output of the next inverter and of its successors in the chain.

It will be readily understood then that the chain can be arbitrarily cut up into a succession of operators whose input and/or output terminals are located at different points of the diagram of FIG. 1.

Figure 3:
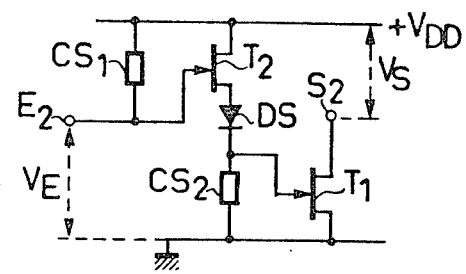
FIGS. 3 to 5 show embodiments of inverters of the invention.

By way of example, if the closed contour 21 delimits the inverter of FIG. 1, with its terminals $E_1$ and $S_1$ designating the terminals A and $\overline{A}$ in the diagram of this basic inverter, the closed contour 22 delimits an inverter derived from the basic inverter, with terminals $E_2$ (input) and $S_2$ (output). This derived inverter is shown in FIG. 3.

In this figure the same references have been used to designate the same components as in FIG. 1.

This is then an inverter which corresponds to an embodiment of the invention, i.e. the inverter which does not have a diode in the input branch or half-branch. We find in fact an input terminal $E_2$ with the indication of an input voltage $V_E$ of the signal which is applied between $E_2$ and ground. The resistive loads $CS_1$ and $CS_2$, transistor $T_2$, and diode DS occupy positions which are the homologues of those of FIG. 1. On the other hand, in an output half-branch we have transistor $T_1$.

This inverter will be designated hereafter as "open-drain output inverter" because of the position of output $S_2$. The output voltage signals $V_S$ should be collected between $S_2$ and pole $+V_{DD}$.

It can be easily seen that this inverter has the same properties of compatibility as the basic inverter, i.e. that it is capable of forming, like the inverter of FIG. 1, a chain of operators which is only differentiated from the chain of FIG. 2 by the input and output conditions. In fact, at points $E_2$ and $S_2$ it is sufficient to respect the logic levels observable in the chain of FIG. 2 in order to obtain a succession of compatible signals.

By way of example, we turn again to the closed contour 23 of FIG. 2, delimiting an inverter with input $E_3$ and output $S_3$, which is differentiated from the inverter of FIG. 1 by a reverse arrangement of the input and output branches. This inverter may be used in the construction of multi-input logic operators described in the above-mentioned patent application.

Finally, the closed contour 24 of FIG. 2 illustrates a basic inverter that is another embodiment of the invention.

As in FIG. 3, the references of the components of FIG. 1 are used to designate those of this inverter, with input $E_4$ and output $S_4$, (FIG. 4) called hereafter "open-source output inverter" because of the position of the output terminal at the source of the output transistor.

This basic inverter comprises an input in which the signals are applied between the terminal $E_4$ and the pole $+V_{DD}$, an input branch with a diode D, a resistive load designated by $CS_2$ by analogy with the diagram of FIG. 1, a middle branch with another resistive load, here $CS_1$, and a transistor $T_1$, finally an output branch with a transistor $T_2$, whose source is separated from ground so as to form an output terminal $S_4$.

Figure 5:
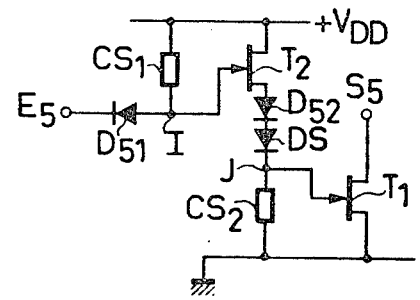

A variation of the inverter of FIG. 3 is shown in FIG. 5 which follows from the diagram of FIG. 3 by inserting two additional diodes, one $D_{51}$ between the input, designated by $E_5$, and the point I of the typical diagram (FIG. 1), the other $D_{52}$ being in series between the diode DS of the diagram of FIG. 3 and the source of transistor $T_2$.

It can be easily seen that the inverter of FIG. 5 is "compatible". With diode $D_{51}$ added so as to create an "AND" type function at the logic operator input, diode $D_{52}$ is only added to compensate for the input-level shift caused by diode $D_{51}$. However, the supply of this inverter requires a slightly higher voltage supply because of the presence of the diode.

Examples of operators will be described hereafter representing logic organizations derived from the inverters of FIGS. 3 to 5.

These are in particular circuits able to be constructed as gallium arsenide integrated structures, the diodes being of the Schottky type.

FIRST EXAMPLE

A three-level logic operator is obtained from the "open-source output" inverter of FIG. 4, as follows (FIG. 6):

(1) For each input branch resistive load, these branches being themselves doubled (or quadrupled in all), there are two inputs with diode DS, providing an OR function in each input half-branch.

(2) For each input branch transistor ($T_1$, $T'_1$), a dual-gate transistor is adopted, providing an AND function. On each gate there is an input branch with a resistive load which is proper thereto ($CS_{21}$, $CS_{22}$, $CS'_{21}$, $CS'_{22}$), thus providing a NOR function.

(3) Transistors $T_1$ and $T'_1$ have common drain and source, the load $CS_1$ being unique for the operator.

Figure 23:
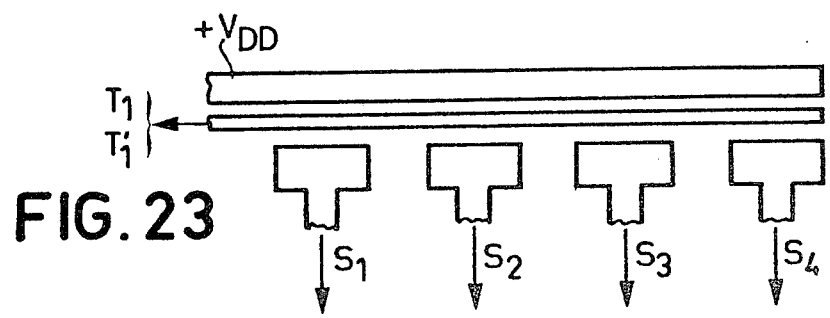
FIGS. 23 and 24 show integrated-circuit structures.

(4) n output transistors ($T_{21}$, $T_{22}$, ... $T_{2n}$) are mounted with a drain common to pole $+V_{DD}$, a common grid connected to the drain of $T_1$, and n sources for forming as many independent outputs. FIG. 23 shows, seen from above, the electrode metalizations of a 4-output integrated circuit.

Figure 6:
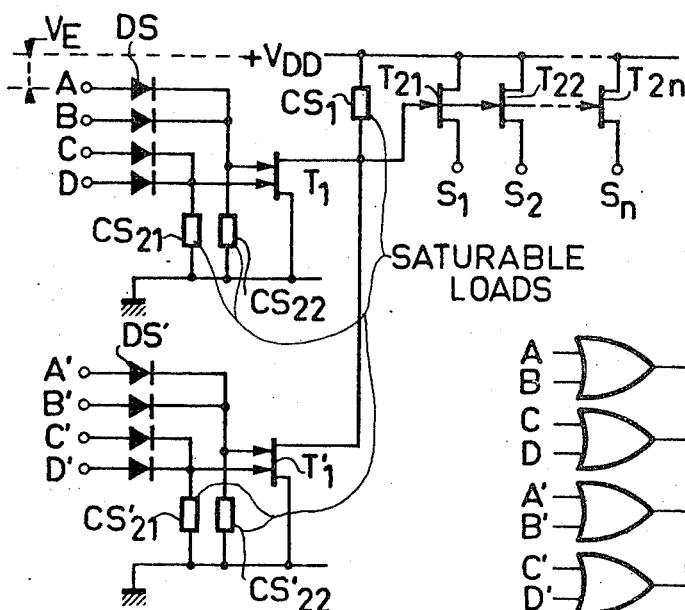
FIG. 6 shows a logic operator derived from the diagram of FIG. 4.
Figure 7:
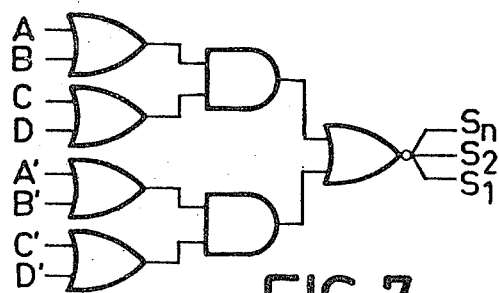
FIG. 7 is a logic diagram equivalent to that of FIG. 6.

FIG. 7 gives the equivalent logic diagram of the operator of FIG. 6:

OR-AND-NOR with n independent outputs.

SECOND EXAMPLE

A three-level logic operator is obtained from the "open-drain output" inverter of FIG. 5, as follows (FIG. 8):

(1) Two circuit portions are formed each comprising the input branch and the middle branch of the inverter of FIG. 5, disregarding the output half-branch and, further, by placing two $T_2$ type transistors in parallel, i.e. $T_{21}$ and $T'_{21}$ for one portion and $T_{22}$, $T'_{22}$ for the other portion.

Figure 24:
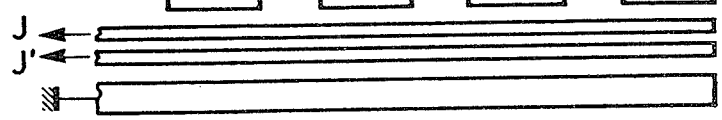

(2) In addition, these circuit portions are completed on each side:

(a) on the "output" side, a series of dual-gate transistors $T_{11}$, $T_{12}$ ... $T_{1n}$ with a common source to ground, n drains for forming independent outputs and two common gates connected respectively to points J and J' of the middle branches of the above-mentioned circuit portion. FIG. 24 shows, seen from above, the electrode metalizations of a 4-output integrated circuit;

(b) on the "input" side, the input branches are doubled by connecting each of them to each of the type $T_1$ transistors mounted in parallel and the half-branch diodes of type $D_{51}$ are doubled by connecting them with common anode to point I of the basic diagram.

Figure 8:
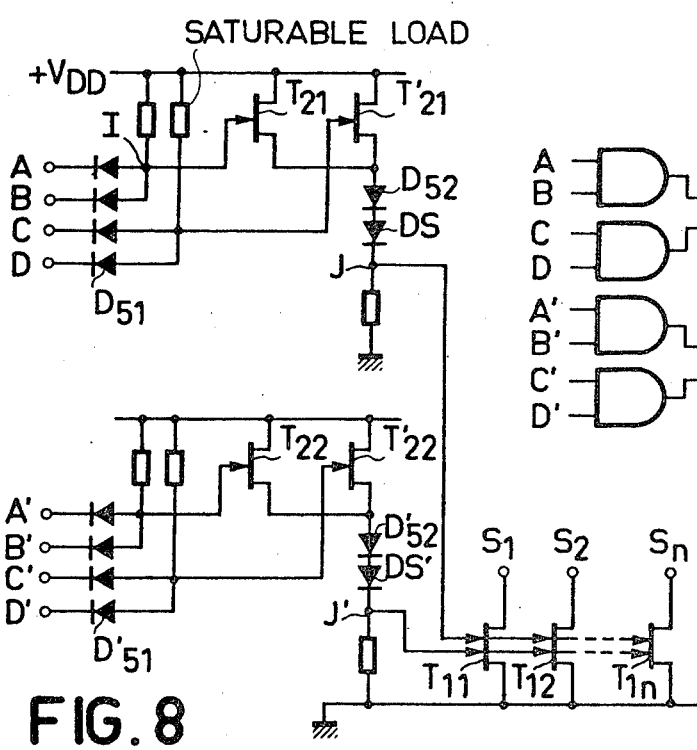
Figure 9:
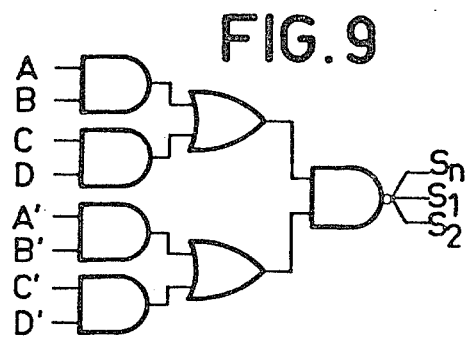

FIG. 9 gives the logic diagram equivalent to the operator of FIG. 8:

AND-OR-NAND

THIRD EXAMPLE

A 16-input and multi-output logic operator (FIG. 10) of a composite type, having different functions depending on the output used, is obtained by combining two logic operators of the type of FIG. 6.

In fact, by wiring the outputs $S_1$ and $S_2$ of each of these operators to a common connection point Z, a function of the "wired OR" type is added to the equivalent logic diagram.

Figure 11:
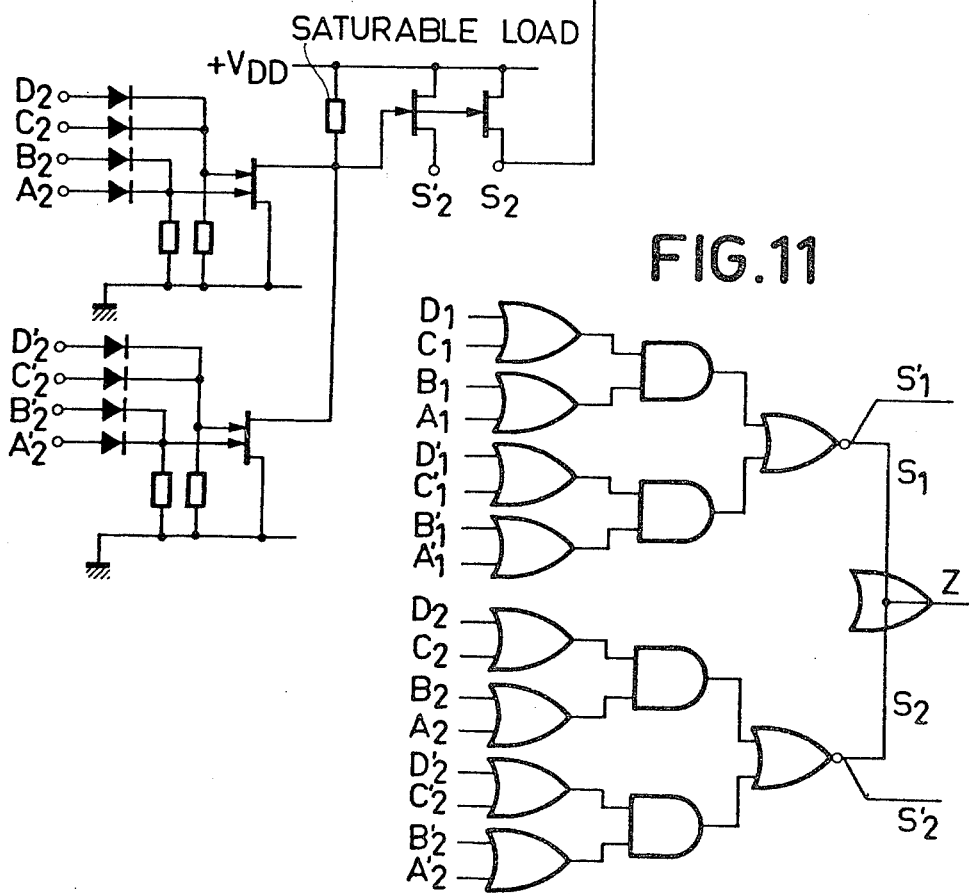

FIG. 11 gives the equivalent logic diagram of this operator. It can be seen that, depending on the output used, we have in the case of non-wired outputs $S'_1$ and $S'_2$, the complex three-level function:

OR-AND-NOR whereas, between point Z and ground, we have the four-level function:

OR-AND-NOR-wired-OR

There is represented at $P_c$ the beginning of a logic gate whose input is connected to the output Z. This gate only serves for illustrating the fact that the load must be connected between the open-source output terminal and ground.

Figure 10:
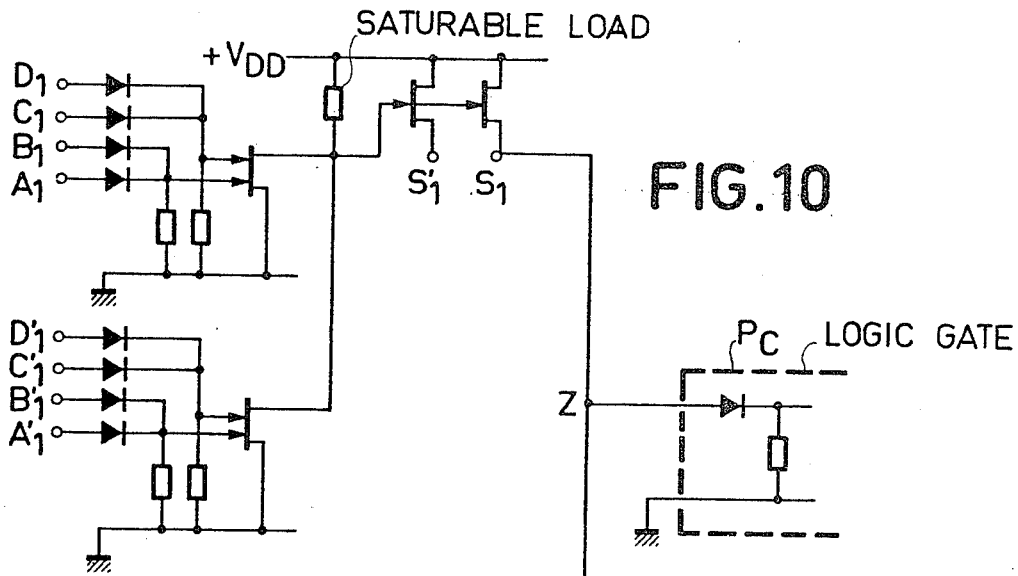

It is important to emphasize that the response at outputs Z, $S'_1$ and $S'_2$ is obtained after the logic signals have passed through the same number of semiconductor elements as in the basic inverter, i.e. a Schottky diode and two transistor gate-source junctions. Accordingly, the response of the composite gate of FIG. 10 is obtained in a single passage, which means that the increase of the logic possibilities of the operator is achieved without loss of dynamic performance other than that, a priori of second order, resulting from the increase in the nodal stray capacities.

Furthermore, each of the independent outputs may be dimensionally adapted to the capacitive load which it controls, so in accordance with the outputted result. This advantage is important for optimizing the overall performance in a complex circuit.

FOURTH EXAMPLE

A composite logic operator is obtained (FIG. 12) as a result of the combination of two operators of the type of FIG. 8.

This operator, similar to the preceding one, also comprises 16 inputs, independent outputs S'$_1$ and S'$_2$ and outputs S$_1$ and S$_2$ wired at a point Z.

However the logic functions provided are in this case, for the non-wired outputs:

AND-OR-NAND and for the Z output, at a gate P'$_c$ connected between Z and +V$_{DD}$,

AND-OR-NAND-AND.

Remarks may be made similar to those for the preceding example insofar as the speed of these logic operators is concerned.

The structures of the third and fourth examples may be simplified so as to obtain gates with a reduced number of inputs and/or with simpler logic functions. The following examples show this.

FIFTH EXAMPLE

A logic operator (not shown) derived from the operator of FIG. 12 is obtained by omitting the input diodes as well as one of the two diodes of the middle branch. It can be easily seen that the functions provided by this operator are the following, at the wired output Z:

OR-AND-NOR.

This operator presents a power-supply compatibility with that of FIG. 10 and the same number of elements to pass through (one diode and two gate-source junctions) so a speed of the same order.

SIXTH EXAMPLE

A logic operator is obtained, FIG. 13, similar in certain points to that of FIG. 10, particularly insofar as the input half-branches and the whole of the outputs designated as in FIG. 10 are concerned, but differing therefrom by the replacement of the dual-gate transistors of FIG. 10 by single-gate transistors, which causes correlatively:

(1) A reduction by half of the number of inputs, this latter passing from 16 to 8.

(2) A reduction in the number of logic functions accomplished; it can easily be seen that these are the following:

OR-NAND for output Z

NOR for the S' outputs (homologues of those of FIG. 12), Z obtained, as in FIG. 10, by wiring the outputs S$_2$ and S$_1$.

FIGS. 14 and 15 give the equivalent logic diagrams of the operator of FIG. 13.

SEVENTH EXAMPLE

Figure 16:
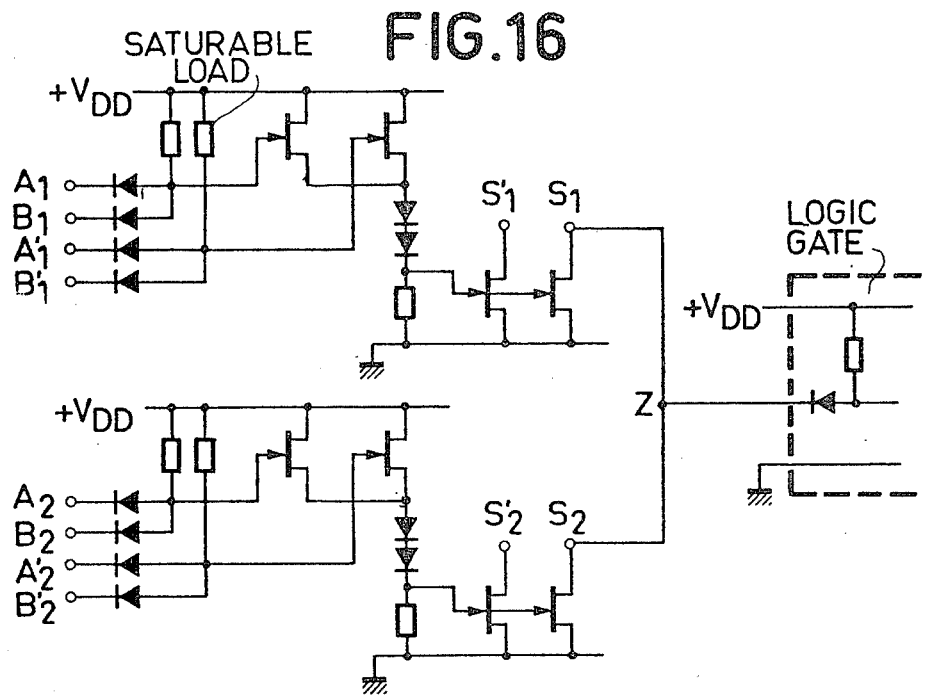

A logic operator is obtained, FIG. 16, similar in certain points to that of FIG. 12, particularly insofar as the circuit portions are concerned whose outputs are connected to the gates of the dual-gate transistors, but which differ therefrom because these transistors are replaced by single-grid transistors, which causes correlatively the following differences:

(1) A reduction by half of the number of inputs, this number passing from 16 to 18.

(2) A reduction in the number of logic functions, these being then:

AND-NOR for the Z output of the 8-input gate and for the outputs S'$_1$ and S'$_2$ (of the four-input gates).

Figure 17:
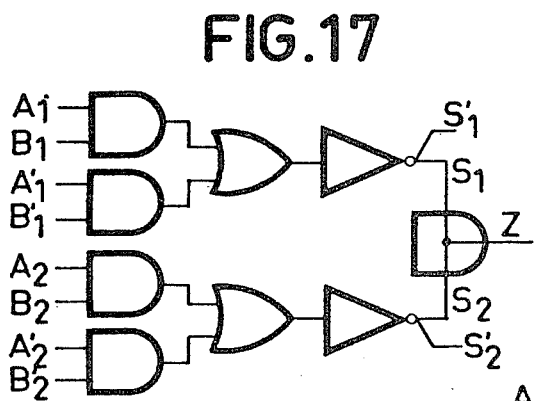
Figure 18:
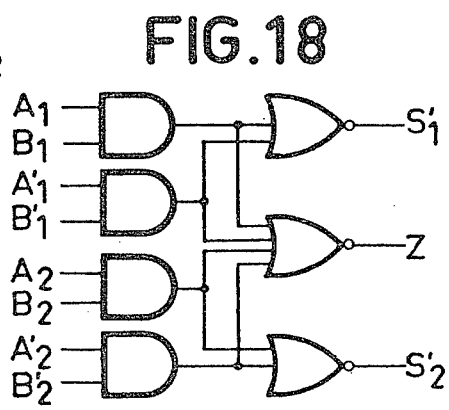

FIGS. 17 and 18 give the equivalent logic diagrams of the operator of FIG. 16.

EIGHTH EXAMPLE

It is desired to obtain a logic operator able to provide, under precise conditions of supply with logic signals A and B as well as with their complements $\overline{A}$ and $\overline{B}$, arriving respectively at four inputs numbered from 1 to 4, the logic functions:

$$S = A \oplus B \tag{1}$$

$$S = \overline{A \oplus B} \tag{2}$$

thus providing the "exclusive OR" function or the same complemented function.

Figure 4:
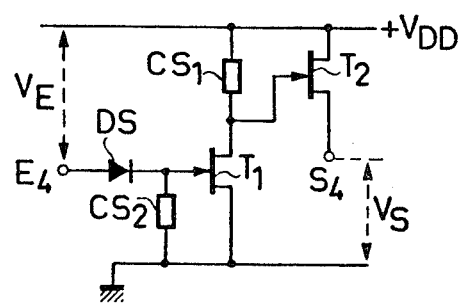
Figure 19:
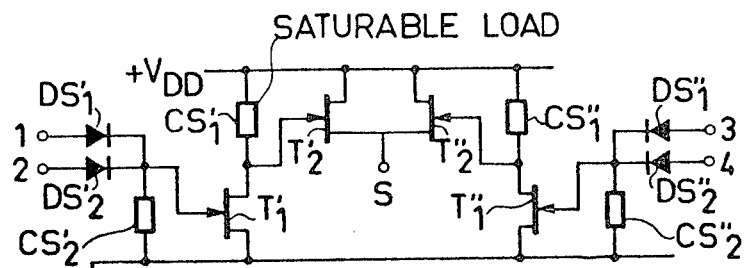

This operator was constructed, FIG. 19, from two inverters of the type shown in FIG. 4, with inputs 1 and 2 on the one hand, 3 and 4 on the other, whose outputs are connected so as to form a single output S.

The homologous resistive loads of the two inverters are shown by CS'$_1$ and CS''$_1$, and similarly for the transistors T$_1$ (T'$_1$, T''$_1$) and T$_2$ (T'$_2$, T''$_2$), these latter having their sources connected together so as to form the output S. Thus a "wired OR" is obtained.

Figure 20:
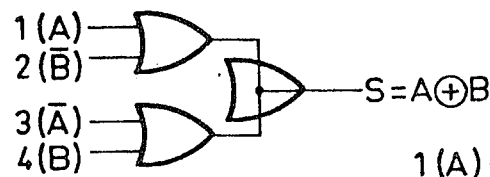
Figure 21:
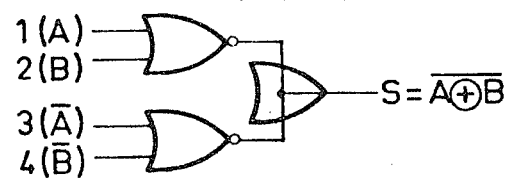

FIGS. 20 and 21 give equivalent logic diagrams which differ according to the manner of supplying inputs 1, 2, 3 and 4 with the signals A and B or their complements.

Summing up:

(1) If the two inputs of the same inverter are supplied with logic signals A and $\overline{B}$ respectively, and if the inputs of the other inverter are supplied with the complements of these signals, the resulting signal of the logic equation (2) is obtained, which means that the complementary function of the "exclusive OR" is obtained.

(2) If the two inputs of the same inverter are supplied with logic signals A and B respectively, and if the two inputs of the other inverter are supplied with the complements of these signals, the "exclusive OR" function is obtained (equation 1).

NINTH EXAMPLE

A complete adder, FIG. 22, is formed by using logic operators identical to the one of the last example (O$_1$ and O$_3$) or similar (O$_2$) thereto.

Let X$_n$, Y$_n$ and R$_{n-1}$ be the inputs of the adder whose outputs S$_n$ and R$_N$ are, conventionally, by identifying the designations of the references and the values of the logic signals:

$$S_n = X_n \oplus Y_n \oplus R_{n-1}$$

$$R_n = X_n \cdot Y_n \oplus (X_n \oplus Y_n) \cdot R_{n-1}$$

The operator O$_2$ differs from that of FIG. 19 because, in the inverter of this figure, a transistor is added having its drain to pole +V$_{DD}$, its source open (type S' output) and its grid connected to that of one of the output transistors of the operator.

We find in addition in the adder:

inverters 221, 222 and 223, at the rate of one per input, which inverter is for example of the type shown in FIG. 1;

an operator O$_4$ which corresponds to one of the dual-input inverters which form together the operator of FIG. 19. The "wired OR" of this operator is purely symbolic, the electric circuit only comprising a simple connection between the output S' of the operator $O_2$ and the output of the inverter of operator $O_4$;

The operation of such an adder can be readily seen in the equivalent diagram of FIG. 22.

What is claimed is:

1. A logic inverter, of the type using two field-effect transistors of the quasi-normally-off type, comprising an input terminal intended to be excited by logic signals applied between this terminal and a first pole of a single supply source, the other pole of which is grounded and which further comprises:

an input branch consisting of a diode in series with a first resistive load one terminal of which is grounded;

a middle branch comprising a second resistive load one terminal of which is connected to said first pole and a first transistor whose source is grounded, whose drain is connected to the second resistive load and whose gate is connected to the point situated between the diode and the first resistive load;

an output branch comprising a second transistor whose drain is connected to said first pole, whose source is connected to the output terminal of the inverter and whose gate is connected to the point situated between the drain of the first transistor and the second resistive load, the logic signals being recovered between the output terminal and ground.

2. A logic operator comprising at least one inverter as claimed in claim 1, comprising in its output branch at least one additional transistor having its drain connected to said first pole, its gate connected to the gate of the initial transistor of said output branch, and its source connected to an additional output terminal delivering signals between this terminal and ground.

3. The logic operator as claimed in claim 2, wherein said middle branch comprises at least two parallel transistors, the gate of each of these transistors being connected to a separate input branch.

4. The logic operator as claimed in claim 2, wherein said middle branch comprises at least two dual-gate transistors each of the gates being connected to a separate input branch.

5. The logic operator as claimed in claim 4, wherein at least one of the separate input branches comprises two input diodes whose electrodes, distinct from the input terminals, are mutually connected.

6. A composite operator having at least two logic operators of the type whereby each logic operator uses two field-effect transistors of the quasi-normally-off type, each said logic operator comprising an input terminal intended to be excited by logic signals applied between this terminal and a first pole of a single supply source, the other pole of which is grounded and whereby each said logic operator further comprises:

an input branch consisting of a diode in series with a first resistive load, one terminal of which is grounded;

a middle branch comprising a second resistive load one terminal of which is connected to said first pole and a first transistor whose source is grounded, whose drain is connected to the second resistive load and whose gate is connected to the point situated between the diode and the first resistive load;

an output branch comprising a second transistor whose drain is connected to said first pole, whose source is connected to the output terminal of the inverter and whose gate is connected to the point situated between the drain of the first transistor and the second resistive load, the logic signals being recovered between the output terminal and ground, said output branch further comprising at least one additional transistor having its drain connected to said first pole, its gate connected to the gate of the initial transistor of said output branch, and its source connected to an additional output terminal delivering signals between this terminal and ground wherein at least one of said output terminals from each of said logic operators are connected so as to form a single output terminal.

7. A logic operator inverter having two inverters of the type whereby each said inverter uses two field-effect transistors of the quasi-normally-off type, each said inverter comprising an input terminal intended to be excited by logic signals applied between this terminal and a pole of a single supply source, the other pole of which is grounded and each said inverter further comprises:

an input branch consisting of a diode in series with a first resistive load one terminal of which is grounded;

a middle branch comprising a second resistive load one terminal of which is connected to said first pole and a first transistor whose source is grounded, whose drain is connected to the second resistive load and whose gate is connected to the point situated between the diode and the first resistive load;

an output branch comprising a second transistor whose drain is connected to said first pole, whose source is connected to the output terminal of the inverter and whose gate is connected to the point situated between the drain of the first transistor and the second resistive load, the logic signals being recovered between the output terminal and ground wherein, on the input branch of each inverter, there is mounted an additional diode so that said diode and said additional diode have, respectively, an electrode connected to a separate input terminal and a common electrode and wherein the transistors of the output branches have their drains common and their sources connected to a common output terminal.

8. A full adder having a plurality of logic operators each of said logic operators having two inverters of the type whereby each inverter uses two field-effect transistors of the quasi-normally-off type, each said inverter comprising an input terminal intended to be excited by logic signals applied between this terminal and a pole of a single supply source, the other pole of which is grounded and each said inverter further comprises:

an input branch consisting of a diode in series with a first resistive load, one terminal of which is grounded;

a middle branch comprising a second resistive load, one terminal of which is connected to said first pole and a first transistor whose source is grounded, whose drain is connected to the second resistive load and whose gate is connected to the point situated between the diode and the first resistive load;

an output branch comprising a second transistor whose drain is connected to said first pole, whose source is connected to the output terminal of the inverter and whose gate is connected to the point situated between the drain of the first transistor and the second resistive load, the logic signals being recovered between the output terminal and ground wherein, on the input branch of each inverter, there is mounted an additional diode so that said diode and said additional diode have, respectively, an electrode connected to a separate input terminal and a common electrode and wherein the transistors of the output branches have their drains common and their sources connected to a common output terminal wherein, in order to provide the logic functions:

$$S_n = X_n \oplus Y_n \oplus R_{n-1}$$

$$R_n = X_n Y_n \oplus (X_n \oplus Y_n) R_{n-1}$$

for which inputs $X_n$, $Y_n$, $R_{n-1}$, $\overline{X_n}$, $\overline{Y_n}$, and $\overline{R_{n-1}}$ and outputs $S_n$ and $R_n$ are available, a first logic operator of said plurality of logic operators provides the function:

$$X_n \oplus Y_n$$

a second logic operator of said plurality of logic operators provides the function:

$$\overline{X_n \oplus Y_n}$$

said second logic operator further comprising an additional independent output, connected to the input of a third logic operator providing the function:

$$(X_n \oplus Y_n) R_{n-1}$$

so as to give the output $R_n$, the outputs of said first and second operators being connected to the inputs of a fourth logic operator, of the same type as said first logic operator whose output gives $S_n$.

* * * * *